United States Patent
Furumi

(10) Patent No.: US 7,228,475 B2
(45) Date of Patent: Jun. 5, 2007

(54) PROGRAM, TEST APPARATUS AND TESTING METHOD

(75) Inventor: Shinji Furumi, Tokyo (JP)

(73) Assignee: Advantest Corporation, Tokyo (JP)

( * ) Notice: Subject to any disclaimer, the term of this patent is extended or adjusted under 35 U.S.C. 154(b) by 295 days.

(21) Appl. No.: 10/954,727

(22) Filed: Sep. 30, 2004

(65) Prior Publication Data

US 2006/0085712 A1    Apr. 20, 2006

(51) Int. Cl.
  *G01R 31/28* (2006.01)
(52) U.S. Cl. ..................................... 714/731
(58) Field of Classification Search ............. 714/718, 714/719, 723, 724, 730, 731
  See application file for complete search history.

(56) References Cited

U.S. PATENT DOCUMENTS

| 6,099,161 A | 8/2000 | Furlan |
| 6,324,485 B1 | 11/2001 | Ellis |
| 7,079,971 B2 * | 7/2006 | Fukuda ..................... 702/117 |

FOREIGN PATENT DOCUMENTS

| JP | 3-71197 | 3/1991 |
| JP | 4-250508 | 9/1992 |

OTHER PUBLICATIONS

International Search Report and Written Opinion of The International Searching Authority issued for International Application No. PCT/JP2005/018594 mailed on Dec. 14, 2005, 10 pages.
Patent Abstracts of Japan, Publication No. 03071197, Publication Date: Mar. 26, 1991, 1 page.
Patent Abstracts of Japan, Publication No. 04250508, Publication Date: Sep. 7, 1992, 1 page.

* cited by examiner

*Primary Examiner*—Cynthia Britt
(74) *Attorney, Agent, or Firm*—Osha•Liang LLP

(57) ABSTRACT

A recording medium has a program recorded to operate a testing apparatus for testing an electronic device. The program causes the testing apparatus to perform functions as a comparing unit for comparing an output signal from the electronic device with an expected value, a timing generating unit for generating a rate signal and providing the comparing unit with the rate signal, wherein the rate signal determines timing at which the comparing unit compares the output signal with the expected value, a fail memory for saving the comparison results obtained by comparing the output signal with the expected value successively according to the rate signal to different addresses, and a period calculating unit for calculating a period of the output signal based on the comparison results stored successively in the fail memory, when executing a test for measuring the period of the output signal.

8 Claims, 4 Drawing Sheets

PROGRAM, TEST APPARATUS AND TESTING METHOD

BACKGROUND OF THE INVENTION

1. Field of the Invention

The present invention relates to a recording medium on which a program is recorded to operate a testing apparatus for testing an electronic device, a testing apparatus and method for testing an electronic device. More particularly, the present invention relates to a testing apparatus, which can measure the period of an output signal from an electrical device.

2. Description of the Related Art

Recently, for electronic devices such as a semiconductor memory and the like, devices, which have a function of outputting a signal with a fixed period, such as an internal clock, have increased. Such a signal needs to be formed to have proper waveform in order to be transferred to a device of next step. For this, in case of testing an electronic device, it is desirable to measure the frequency of the signal, and the like.

With incriminations of such a device, testing apparatus, which have a function of measuring the frequency of a signal, have increased. These kinds of testing apparatus measure the frequency of the signal by using a frequency counter and the like. However, in most of the testing apparatus for memories, which have been used conventionally, measuring means, such as the frequency counter, is not provided. In these kinds of testing apparatus, it was impossible to measure the frequency of the internal clock of an electronic device and the like.

An object of the present invention is to provide a recording medium on which a program of a testing apparatus is recorded, a testing apparatus and a testing method, which are capable of overcoming the above drawbacks accompanying the conventional art. The above object can be achieved by combinations described in the independent claims. The dependent claims define further advantageous and exemplary combinations of the present invention.

SUMMARY OF THE INVENTION

In order to overcome the above drawbacks, according to a first aspect of the present invention, a recording medium, on which a program is recorded to operate a testing apparatus for testing an electronic device, is provided, wherein said program makes said testing apparatus perform functions as a comparing unit for comparing the output signal from said electronic device with an expected value signal to be applied, a timing generating unit for generating a rate signal and providing said comparing unit with the rate signal, wherein the rate signal determines timing at which said comparing unit compares the output signal with the expected value signal, a fail memory for storing the comparison results obtained by comparing the output signal with the expected value signal successively according to the rate signal to different addresses successively, and a period calculating unit for calculating the period of the output signal based on the comparison results stored successively in said fail memory, in case of executing a test for measuring the period of the output signal.

The program may further make said testing apparatus perform functions as an expected value control unit for providing said comparing unit with the expected value signal which is fixed to a prescribed value, in case of executing a test for measuring the period of the output signal, and providing said comparing unit with the expected value signal corresponding to a test pattern supplied to said electronic device, in case of executing a test without measuring the period of the output signal.

Furthermore, said program may further make the testing apparatus perform functions as a rate control unit for letting said timing generating unit generate the rate signal with a fixed period, in case of executing a test for measuring the period of the output signal.

Furthermore, said program makes said comparing unit compare the output signal with the expected value signal until the comparison results are stored successively in all addresses of said fail memory, in case of executing a test for measuring the period of the output signal.

Furthermore, the program may make said period calculating unit generate time sequence data by arranging the comparison results each of which is stored in each address of said fail memory in time sequence, in case that the number of times of switching the value of the time sequence data is larger than a prescribed value, said period calculating unit calculate the period of the output signal based on the time sequence data, and, in case that the number of times of switching the value of the time sequence data is smaller than a prescribed value, said period calculating unit store the time sequence data, said fail memory eliminate the stored comparison results, said comparing unit compare the output signal with the expected value signal until the comparison results are newly stored successively in all addresses of the fail memory, said period calculating unit further generate new time sequence data, and said period calculating unit calculate the period of the output signal based on the stored time sequence data and the new time sequence data.

Furthermore, said program makes said testing apparatus execute the test for measuring the period of the output signal, in case that an internal clock of said electronic device is supplied to said comparison unit as the output signal.

According to a second aspect of the present invention, a testing apparatus for testing an electronic device is provided, wherein the testing apparatus comprises a comparing unit for comparing the output signal from said electronic device with an expected value signal to be applied, a timing generating unit for generating a rate signal and providing said comparing unit with the rate signal, wherein the rate signal determines timing at which said comparing unit compares the output signal with the expected value signal, a fail memory for saving the comparison results obtained by comparing the output signal with the expected value signal successively according to the rate signal to different addresses successively, and a period calculating unit for calculating the period of the output signal based on the comparison results stored successively in said fail memory, in case of executing a test for measuring the period of the output signal.

According to a third aspect of the present invention, a testing method for testing an electronic device is provided, wherein the testing method comprises a comparing step for comparing the output signal from said electronic device with an expected value signal to be applied, a timing generating step for generating a rate signal and providing said comparing unit with the rate signal, wherein the rate signal determines timing at which said comparing unit compares the output signal with the expected value signal, a fail saving step for saving the comparison results obtained by comparing the output signal with the expected value signal successively according to the rate signal to different addresses successively, and a period calculating step for calculating the period of the output signal based on the comparison results stored successively in said fail memory, in case of executing a test for measuring the period of the output signal.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
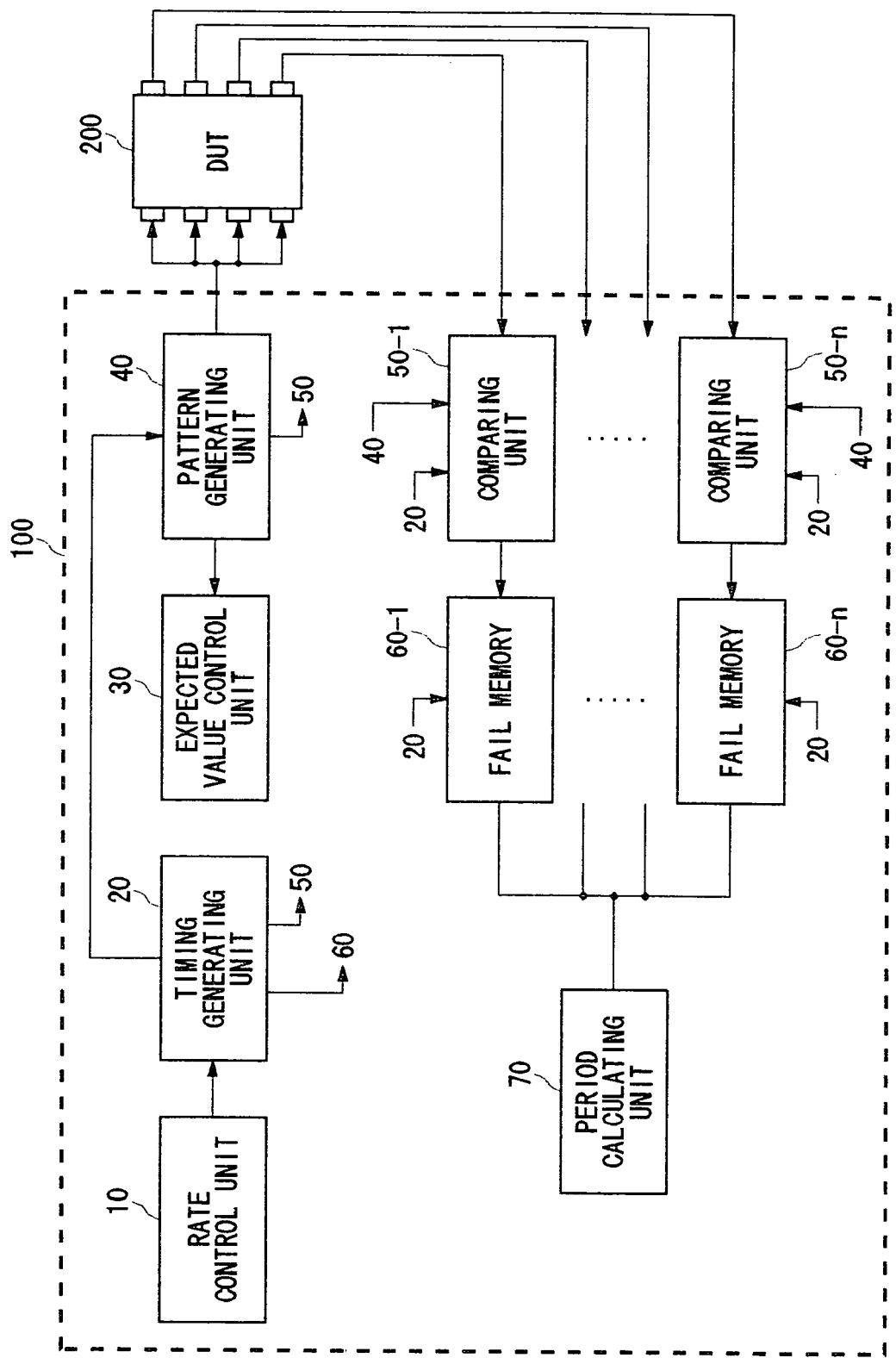
FIG. 1 shows an example of the configuration of a testing apparatus 100 according to an embodiment of the present invention.

FIG. 1 shows an example of the configuration of a testing apparatus 100 according to an embodiment of the present invention. The testing apparatus 100 is an apparatus for testing an electronic device 200, such as a semiconductor memory, and includes a rate control unit 10, a timing generating unit 20, an expected value control unit 30, a pattern generating unit 40, a plurality of comparison units (50-1~50-n, hereinafter referred to as 50), a plurality of fail memories (60-1~60-n, hereinafter referred to as 60), and a period calculating unit 70.

The pattern generating unit 40 generates a test pattern which is to be supplied to each of the input pins of the electronic device 200. Further, the timing generating unit 20 generates a timing signal prescribing timing at which the test pattern is to be supplied to the electronic device 200, and provides the pattern generating unit 40 with the timing signal. Then, the pattern generating unit 40 provides the electronic device 200 with the test pattern according to the received timing signal.

The expected value control unit 30 causes the pattern generating unit to generate the expected value which is to be supplied to each comparing unit 50. For example, the expected value control unit 30 generates an expected value signal of the output signal which is to be output by the electronic device 200, based on the test pattern which the pattern generating unit 40 generates. The expected value signal may be identical to the test pattern.

The comparing unit 50 is provided with correspondent to each of the output pins of the electronic device 200, and compares the output signal from the corresponding output pin with the expected value signal applied from the pattern generating unit 40. Here, the comparing unit 50 compares the out put signal with the expected value at the timing prescribed by the applied rate signal.

For example, the comparing unit 50 compares the voltage of the output signal with a predetermined threshold voltage at the timing prescribed by the rate signal, and converts the output signal into a digital signal shown by H/L. The timing generating unit 20 generates a rate signal and provides the comparing unit 50 with the rate signal. Then, the comparing unit 50 outputs the comparison result between the digital signal and the expected value signal.

The fail memory 60 is provided with correspondent to each of the comparing units of the electronic device 200, and stores the comparison result for the corresponding comparing unit 50. For example, if the output signal coincides with the expected value, the comparing unit 50 outputs "Pass" as a comparison result, otherwise, the comparing unit 50 outputs "Fail" as a comparison result.

By the above operation, the testing apparatus 100 executes a test for a memory unit, a logic unit of the electronic device 200, and the like. Further, the testing apparatus 100 has a function of testing the period of the period signal from the internal clock output by the electronic device 200. In this case, one of the comparing units 50 is connected to one of a plurality of pins of the electronic device 200, which outputs the periodic signal. A user can set up which comparing unit 50 is to be allotted to the pin of the periodic signal in advance before starting the test. For the present example, it will be described as to the case in which the comparing unit 50-n is allotted to the pin of the periodic signal.

Like other comparing units 50, the comparing unit 50-n compares the input periodic signal with the expected value signal. Here, in case of executing the test for measuring the period of the output signal, the expected value control unit 30 makes the expected value, which is fixed to a predetermined value, be supplied to the comparing unit 50, and, in case of executing the test without measuring the period of the output signal, the expected value control unit 30 makes the expected value signal which corresponds to the test pattern supplied to the electronic device, be supplied to the comparing unit 50. In the present example, the expected value control unit 30 makes the expected value which is fixed to a predetermined value be supplied to the comparing unit 50-n, and the expected values which correspond to the test pattern be supplied to the other comparing units 50. Further, the rate control unit 10 makes the timing generating unit generate the rate signal with a fixed period and provides the comparing unit 50-n with the rate signal.

The comparing unit 50-n executes comparing successively according to the rate signal, and the fail memory 60-n stores the comparison results in different addresses successively. The period calculating unit 70 calculates the period of the periodic signal based on the comparison results, which the fail memory 60 corresponding to the pin outputting the periodic signal stores, in case of executing a test for measuring the period of the output signal. The user determines which comparing memory is to be selected to provide the comparison result to be used, based on the predetermined information before starting the test. For the present example, the period calculating unit 70 calculates the period based on the comparison result which the fail memory 60-n stores.

By the above operations, for testing apparatus which do not have a frequency counter and the like, it is possible to easily calculate the period and the frequency of the output signal output by the electronic device 200. Further, a workstation controlling the operation of the testing apparatus may function as the period calculating unit 70.

Figure 2:
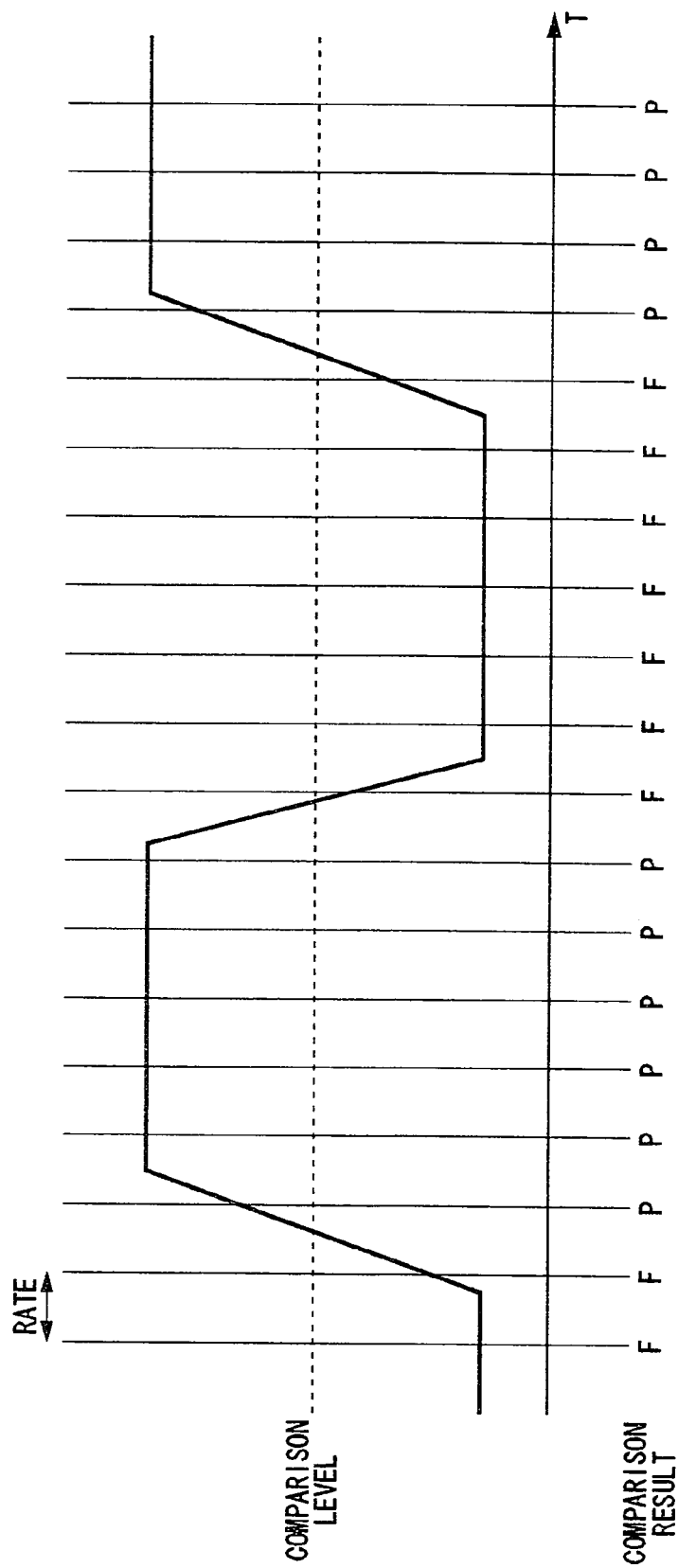
FIG. 2 shows an example of the waveform of an output signal output by an electronic device 200.

FIG. 2 shows an example of the waveform of the output signal output by the electronic device 200. The predetermined comparison level is applied to the comparing unit 50-n, and, as described above, the comparing unit 50-n compares the comparison level with the voltage of the periodic signal at the timing corresponding to the rate signal with a fixed period (rate) and converts the periodic signal into a digital signal. For the comparing unit 50 which is to measure the period of the period signal, a voltage value of which is substantially a half of the waveform of the periodic signal may be previously set as the comparison level.

Further, as described above, the comparing unit 50-$n$ is provided with the expected value signal which is fixed to a predetermined value, and compares the expected value signal with the periodic signal converted into a digital signal. For example, the periodic signal may be compared with the expected value which is fixed to a logical value H with, and may also be compares with a logical value L with the periodic signal. For the present example, the periodic signal is compared with the expected value which is fixed to a logical value H. Therefore, as shown in FIG. 2, the comparison result obtained by comparing the expected value with the periodic signal (Pass or Fail, P or F in FIG. 2) is outputted.

Then, the fail memory 60-$n$ stores the comparison results in the different addresses. For example, every time the comparing unit 50-$n$ outputs a comparison result, the fail memory 60-$n$ may increase successively the address to store the comparison result, and may also decrease successively the address to store the comparison result. The address, in which the fail memory 60-$n$ stores the comparison result, may be generated by, for example, the pattern generating unit 40, successively according to the rate signal applied to the comparison result 50-$n$.

Further, the comparing unit 50-$n$ may continue comparing of the output signals and the expected values until the comparison results are stored in all addresses of the fail memory 60-$n$ successively. Furthermore, the pattern generating unit 40 may continue generating addresses of the fail memory 60-$n$ successively until the comparison results are stored in all addresses of the fail memory 60-$n$ successively.

The period calculating unit 70 generates time sequence data by arranging the comparison results stored in the addresses in time sequence. In case that the fail memory 60-$n$ stores the comparison results in successively increasing or decreasing addresses, the period calculating unit 70 may generate time sequence data by arranging the comparison results in order of the address.

Then, the period generating unit 70 extracts points at which the values of the time sequence data switch, and calculates the edge intervals of the periodic signal by multiplying the widths of the time sequence data between the points by the period of the rate signal. And then, based on each calculated width, the period generating unit 70 calculates the period and the frequency of the periodic signal. For example, in case of detecting three points at which the value of the time sequence data switches, the period of the periodic signal can be calculated by the sum of the edge interval corresponding to the point interval between two preceding points and the edge interval corresponding to the point interval between two following points.

Further, in order to calculate accurately the period of the periodic signal, it is desirable to be able to extract a plurality of points at which the value of the time sequence data switch. However, sometimes it is impossible to extract a plurality of the points because the number of the addresses of the fail memory 60-$n$ is limited. In case that the number of times of switching the value of the time sequence data is larger than a predetermined number of times, the period calculating unit 70 may calculate the period of the output signal based on the time sequence data.

Furthermore, in case that the number of times of switching the value of the time sequence data is smaller than a predetermined number of times, the period calculating unit 70 may store the time sequence data, generate new time sequence data, and calculate the period of the periodic signal based on the stored time sequence data and the new time sequence data. In this case, the fail memory 60-$n$ deletes the comparison result outputted to the period calculating unit 70, and the comparing unit 50-$n$ further executes comparing the periodic signal with the expected value until new comparison results are stored in all addresses of the fail memory 60-$n$ successively. Then, the period calculating unit 70 further new time sequence data based on the comparison results which the fail memory 60-$n$ stores newly.

By the above operations, even though the number of the addresses of the fail memory 60-$n$ is small, it is possible to calculate accurately the period of the periodic signal. Further, the testing apparatus 100 in the present example can calculate the period of the periodic signal in accuracy corresponding to the period of the rate signal, using the conventional configuration.

Further, the testing apparatus may measure the period of the output signal, in case that the internal clock of the electronic device 200 is supplied to the comparing unit 50 as the output signal. It may be decided by the information predetermined by the user before starting the test whether the comparing unit is provided with the internal clock.

Furthermore, in case that the internal clock of the electronic device 200 is supplied to the comparing unit 50 as the output signal, the rate control unit 10 and the expected value control unit 30 may generate the rate signal with a fixed period and generate the expected value signal fixed to a predetermined logical value in order to make the period of the output signal to be measured. It may be determined by the user before starting the test whether the comparing unit is provided with the internal clock.

Figure 3:
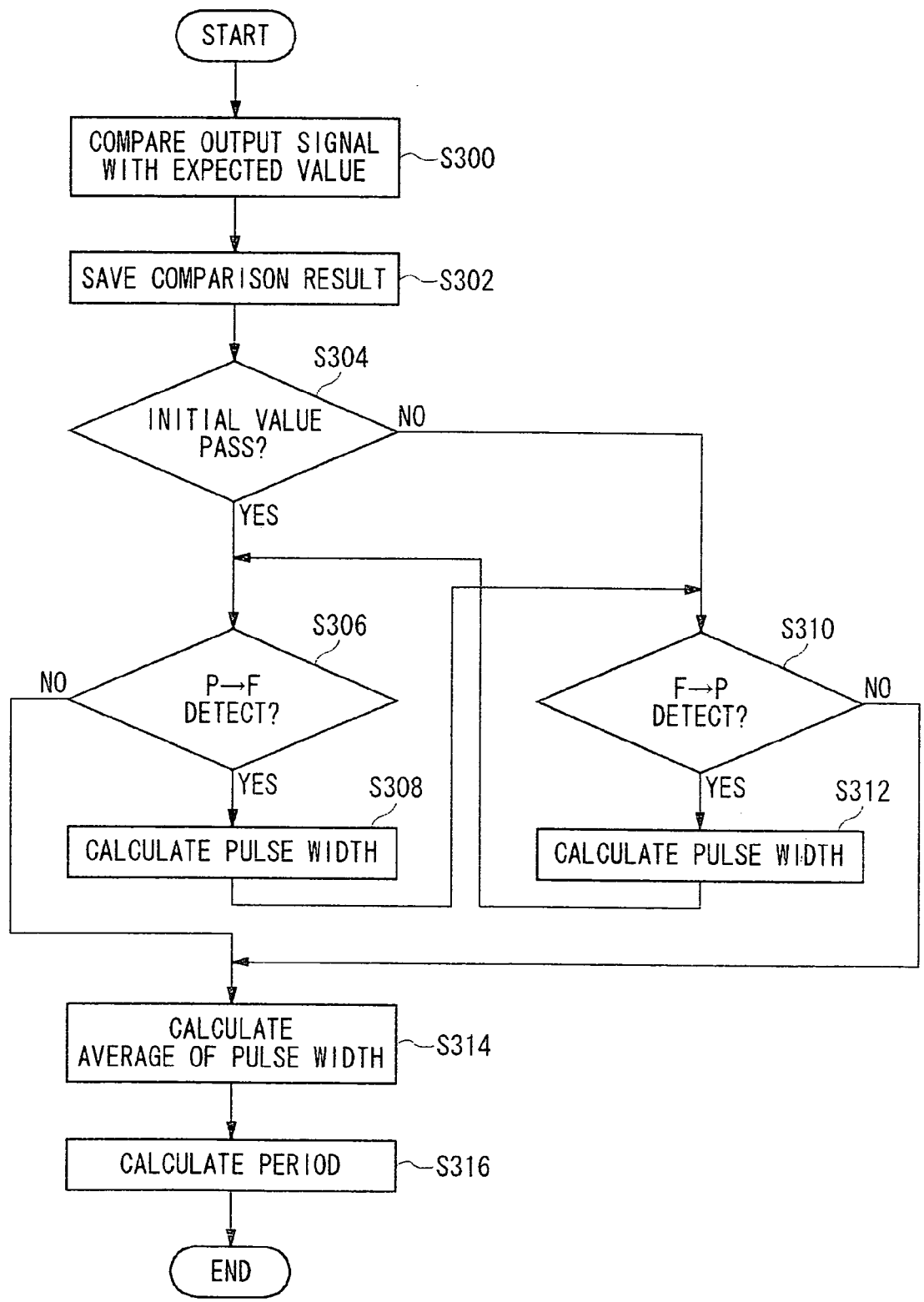
FIG. 3 is a flowchart exemplary showing the operation of the testing apparatus 100.

FIG. 3 is a flowchart exemplary showing the operation of the testing apparatus 100. First of all, in a comparing step S300, the comparing unit 50-$n$ compares the output signal from the electronic device 200 with the expected value signal. Then, in a fail saving step S302, the comparison results of the step S300 are stored successively to different addresses of the fail memory 60-$n$.

Next, the comparison results stored in the fail memory 60-$n$ are arranged in time sequence, and it is determined whether the initial value is Pass or Fail (S304). If the initial value is Pass, it is performed to detect a point at which the comparison result for the time sequence data changes from Pass to Fail (S306) Further, if the initial value is Fail, it is performed to detect a point at which the comparison result for the time sequence data changes from Fail to Pass (S310). Then, if the changing point of the comparison result for S306 or S310 is detected, the processes of S306 and S310 are repeated alternatively. The timing of each of the edges of the periodic signal is detected by the above operation.

Further, if the changing point of the comparison result for S306 or S310 is detected, from the difference between the timing of the changing point and that of the preceding changing point, the pulse width between the corresponding edges of the periodic signal is calculated (S308, S312).

Then, when the detection of the changing point is performed over all the comparison results of the time sequence data, the average value of the pulse widths calculated for each of S308 and S312. Then, the period of the periodic signal is calculated by summing the average of the pulse widths calculated for S308 and the average of the pulse widths calculated for S312 (S316).

Further, the average value of the pulse widths may be calculated for both S308 and S312 in S314, and the period of the periodic signal may be calculated by doubling the average value.

By the above process, even though a test apparatus doesn't have a frequency counter and the like, it is possible to calculate easily the period and the frequency of a periodic signal by the test apparatus.

Figure 4:
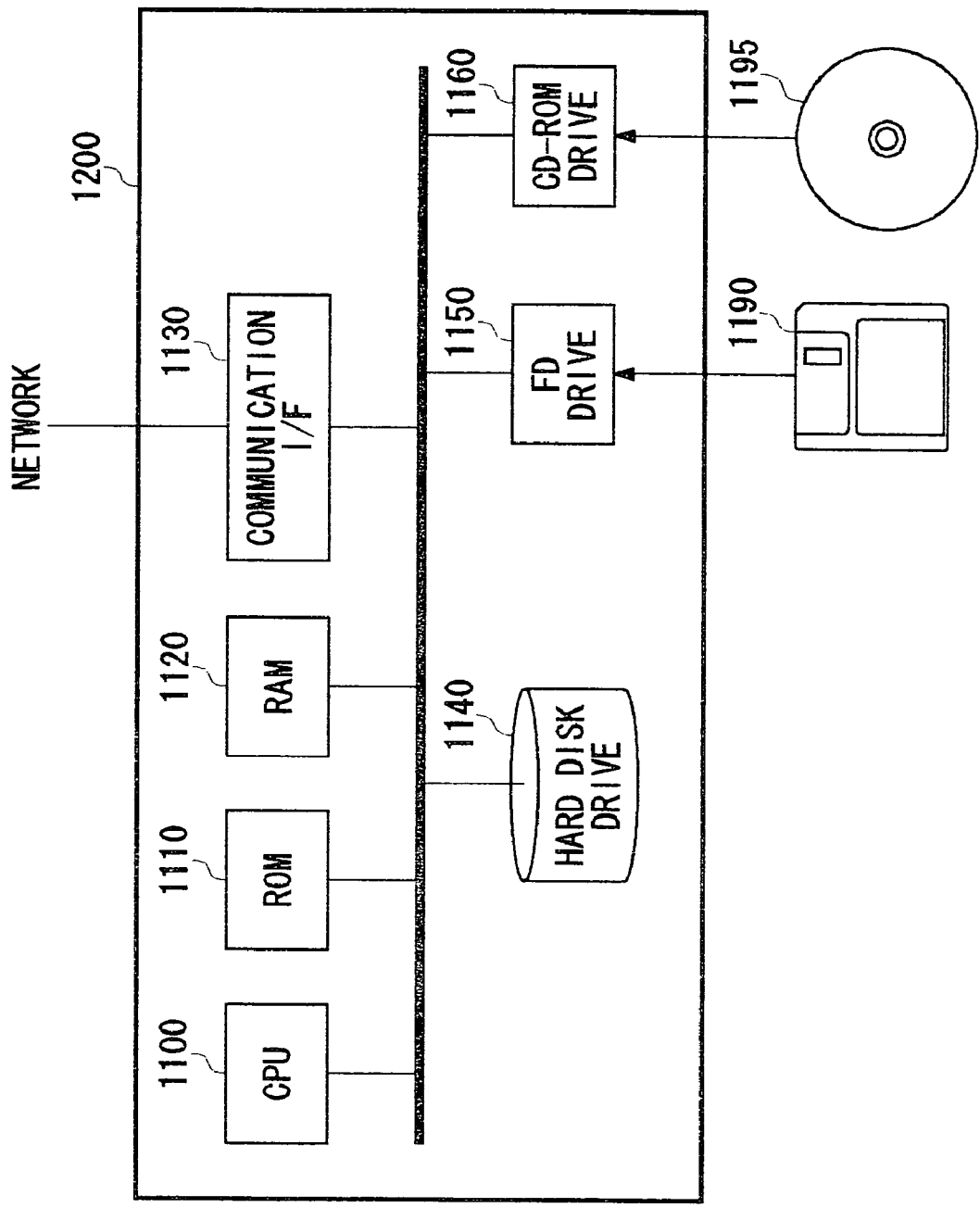
FIG. 4 shows an example of the configuration of a computer 1200 for controlling the testing apparatus for testing an electronic device.

FIG. 4 shows an example of the configuration of a computer 1200 for controlling the testing apparatus which tests an electronic device. In the present example, the computer 1200 stores the program which makes the testing apparatus perform function as the testing apparatus described in FIGS. 1 to 3.

The computer 1200 comprises a CPU 1100, a ROM 1110, a RAM 1120, a communication interface 1130, a hard disk drive 1140, a flexible disk drive 1150, and a CD-ROM drive 1160. The CPU 1100 operates based on the program stored in the ROM 1110, the RAM 1120, the hard disk drive 1140, the flexible disk 1190, and/or a CD-ROM 1195.

For example, the program, which makes the testing apparatus operate, makes the testing apparatus perform function as the rate control unit 10, the timing generating unit 20, the expected value control unit 30, the pattern generating unit 40, a plurality of the comparing units 50, a plurality of the fail memories 60, and the period calculating unit 70.

The communication interface 1130 communicates with each of the elements of the testing apparatus 100, receives information related to the status of each element and the like, and transmits a control signal which controls each element. The hard disk drive 1140, the ROM 1110, or the RAM 1120, an example of the saving apparatus, stores a predetermined information, a program making the CPU 1100 operate, and the like. Further, the program may be stored in a recording medium, such as the flexible disk 1190, the CD-ROM 1195, and the like.

If the flexible disk 1190 stores the program, the flexible disk drive 1150 reads the program from the flexible disk 1190 and provides the CPU 1100 with it. If the CD-ROM 1195 stores the program, the CD-ROM drive 1160 reads the program from the CD-ROM 1195 and provides the CPU 1100 with it.

Further, the program may be read and executed directly by the RAM, and may also be read and executed by the RAM after being installed in the hard disk 1140. Alternatively, the program may be stored in one recording medium, and may also be stored in a plurality of recording media. In addition, the program stored in the recording medium may provide each function by the cooperation with an operating system. For example, the program may request the operating system to perform a part or all of its functions, and provide the functions based on the response from the operating system.

It is possible to use an optical recording media, such as a DVD, a PD, and the like, a magneto-optical recording media, such as a MD and the like, a tape medium, a magnetic recording medium, a semiconductor memory, such as an IC card, a miniature card, and the like, in addition to the flexible disk and the CD-ROM, as a recording medium which the program is stored. A storing apparatus, such as a hard disk, a RAM, and the like which is provided to a server system connected to a dedicated communication network and Internet, may also be used as a recording medium.

Although the present invention has been described by way of exemplary embodiments, it should be understood that those skilled in the art might make many changes and substitutions without departing from the spirit and the scope of the present invention which is defined only by the appended claims.

As the above explanation, according to the present invention, even though a testing apparatus does not have a feature, such as a frequency counter and the like, the apparatus can easily calculate the period and the frequency of the periodic signal.

What is claimed is:

1. A recording medium, on which a program is recorded to operate a testing apparatus for testing an electronic device, wherein said program, when executed, causes said testing apparatus to act as:
   a comparing unit for comparing an output signal from said electronic device with an expected value;
   a timing generating unit for generating a rate signal and providing said comparing unit with the rate signal, wherein the rate signal determines timing at which said comparing unit compares the output signal with the expected value;
   a fail memory for successively storing the comparison results obtained by comparing the output signal with the expected value according to the rate signal to different addresses; and
   a period calculating unit for calculating a period of the output signal based on the comparison results stored successively in said fail memory, when executing a test for measuring the period of the output signal.

2. A recording medium as claimed in claim 1, wherein said program further causes said testing apparatus to act as an expected value control unit for providing said comparing unit with the expected value that is fixed to a prescribed value, when executing a test for measuring the period of the output signal, and providing said comparing unit with the expected value corresponding to a test pattern supplied to said electronic device, when executing a test without measuring the period of the output signal.

3. A recording medium as claimed in claim 2, wherein said program further causes said testing apparatus to act as a rate control unit for causing said timing generating unit to generate the rate signal with a fixed period, when executing a test for measuring the period of the output signal.

4. A recording medium as claimed in claim 3, wherein said program causes said comparing unit to compare the output signal with the expected value until the comparison results are stored successively in all addresses of said fail memory, when executing a test for measuring the period of the output signal.

5. A recording medium as claimed in claim 4, wherein said program causes:
   said period calculating unit to generate time sequence data by arranging the comparison results each of which is stored in each address of said fail memory in time sequence;
   if a number of times of switching a value of the time sequence data is larger than a prescribed value, said period calculating unit to calculate the period of the output signal based on the time sequence data; and
   if the number of times of switching the value of the time sequence data is smaller than a prescribed value, said period calculating unit to store the time sequence data, said fail memory to eliminate the stored comparison results, said comparing unit to compare the output signal with the expected value until the comparison results are newly stored successively in all addresses of the fail memory, said period calculating unit to further generate new time sequence data, and said period calculating unit to calculate the period of the output signal based on the stored time sequence data and the new time sequence data.

6. A recording medium as claimed in claim 2, wherein said program causes said testing apparatus to execute the test for measuring the period of the output signal, if an internal clock of said electronic device is supplied to said comparison unit as the output signal.

7. A testing apparatus for testing an electronic device comprising:
  a comparing unit for comparing an output signal from said electronic device with an expected value;
  a timing generating unit for generating a rate signal and providing said comparing unit with the rate signal, wherein the rate signal determines timing at which said comparing unit compares the output signal with the expected value;
  a fail memory for saving the comparison results obtained by comparing the output signal with the expected value successively according to the rate signal to different addresses; and
  a period calculating unit for calculating a period of the output signal based on the comparison results stored in said fail memory, when executing a test for measuring the period of the output signal.

8. A testing method for testing an electronic device comprising:
  a comparing step for comparing an output signal from said electronic device with an expected value;
  a timing generating step for generating a rate signal and providing said comparing unit with the rate signal, wherein the rate signal determines timing at which said comparing unit compares the output signal with the expected value;
  a saving step for successively saving the comparison results obtained by comparing the output signal with the expected value according to the rate signal to different addresses; and
  a period calculating step for calculating a period of the output signal based on the comparison results stored in said fail memory, when executing a test for measuring the period of the output signal.

* * * * *